(12) United States Patent
Sato

(10) Patent No.: US 8,564,021 B2
(45) Date of Patent: Oct. 22, 2013

(54) SEMICONDUCTOR DEVICE AND ITS MANUFACTURING METHOD

(75) Inventor: Ken Sato, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 312 days.

(21) Appl. No.: 12/853,368

(22) Filed: Aug. 10, 2010

(65) Prior Publication Data

US 2011/0042787 A1    Feb. 24, 2011

(30) Foreign Application Priority Data

Aug. 18, 2009    (JP) ................................ 2009-189153

(51) Int. Cl.
*H01L 29/778* (2006.01)

(52) U.S. Cl.
USPC .................... 257/194; 257/E29.249; 438/172

(58) Field of Classification Search
USPC ........................... 257/194, E29.249; 438/172
See application file for complete search history.

(56) References Cited

U.S. PATENT DOCUMENTS

| 6,476,431 | B1 | 11/2002 | Ohno et al. | |
| 7,364,988 | B2 * | 4/2008 | Harris et al. | 438/478 |
| 2005/0274977 | A1 * | 12/2005 | Saito et al. | 257/192 |
| 2006/0108602 | A1 * | 5/2006 | Tanimoto | 257/192 |
| 2006/0273347 | A1 * | 12/2006 | Hikita et al. | 257/192 |
| 2007/0272945 | A1 * | 11/2007 | Matsuo et al. | 257/194 |
| 2009/0065787 | A1 * | 3/2009 | Kikkawa et al. | 257/76 |

FOREIGN PATENT DOCUMENTS

JP    2000-150538 A    5/2000

* cited by examiner

*Primary Examiner* — Steven J Fulk
(74) *Attorney, Agent, or Firm* — Birch, Stewart, Kolasch & Birch, LLP

(57) ABSTRACT

To suppress adverse affect caused by dopant in a conductive semiconductor layer in a GaN-based device having a structure in which the conductive semiconductor layer is inserted between a substrate and an active layer.

In an HEMT device 10, n-GaN (n-type GaN wafer) is used as a substrate 11. A p-type GaN layer (conductive semiconductor layer) 12 is formed on the substrate 11 for the purpose of reducing a leak current and suppressing current collapse, etc. A non-doped AlN layer (semi-insulating semiconductor layer) 13 is formed on the p-type GaN layer 12, and a channel layer (active layer) 14 formed of semi-insulating GaN and an electron supply layer (active layer) 15 formed of n-AlGaN are sequentially formed by the MBE method, MOVPE method, or the like.

8 Claims, 6 Drawing Sheets

(a)

(b)

SEMICONDUCTOR DEVICE AND ITS MANUFACTURING METHOD

BACKGROUND OF THE INVENTION

1. Field of the Invention

The present invention relates to a structure of a semiconductor device having an active region of a nitride semiconductor on a substrate and a manufacturing method of the semiconductor device.

2. Description of the Related Art

As a semiconductor device using a compound semiconductor, particularly, a high output high frequency semiconductor device, an HEMT (High Electron Mobility Transistor) using GaN can be taken as an example. A schematic cross-sectional structure of an HEMT device 90 is illustrated in FIG. 6. In FIG. 6, a p-type GaN layer (conductive semiconductor layer) 92, a channel layer 93 and an electron supply layer 94 are formed by epitaxial growth on a substrate 91. The channel layer 93 serving as an active layer in HEMT operation is formed of semi-insulating (non-doped) GaN, and electron supply layer 94 serving as an active layer in HEMT operation is formed of n-AlGaN (exactly, n-type $Al_{0.20}Ga_{0.80}N$ for example). A two-dimensional electron gas layer is formed on the channel layer 93 side of the interface between the channel layer 93 and electron supply layer 94. The two-dimensional electron gas layer is formed between a source electrode 95 and drain electrode 96 to allow current to flow between the source and drain electrodes 95 and 96. ON/OFF of the two-dimensional electron gas channel is controlled by voltage applied to a gate electrode 97, whereby switching operation is performed. At this time, the speed (mobility) of the electron in the two-dimensional electron gas becomes extremely high, thereby allowing high-speed operation. Further, since the GaN has a larger band gap than that of GaAs, etc., the HEMT device 90 exhibits a high breakdown voltage and can perform high output operation. In order to obtain favorable amplification characteristics or switching characteristics in this configuration, it is necessary to increase on/off ratio of current flowing between the source and drain electrodes 95 and 96 or on/off ratio of a resistance therebetween. Note that FIG. 6 illustrates the simplest structure of the HEMT device, and the actual structure thereof often differs from that of FIG. 6, wherein, for example, the shape of a contact between source electrode 95 and electron supply layer 94, shape of a contact between the drain electrode 96 and electron supply layer 94, and shape around the gate electrode 97 are actually more optimized than illustrated.

The characteristics of the HEMT device 90 are significantly influenced by the crystallinities of the channel layer 93 and electron supply layer 94 serving as the active layer, and the crystallinities and manufacturing costs of the channel layer 93 and electron supply layer 94 depend strongly on the substrate 91, so that the selection of the material of the substrate 91 is an important factor. For example, the substrate 91 may be an insulating material, such as a sapphire substrate or a semi-insulating SiC substrate. In recent years, as a GaN wafer, an n-GaN (n-type GaN) wafer of a manageable size can be obtained at low cost for use as the substrate 91. In this case, conductivity of the substrate 91 is high.

In the case where a highly conductive substrate is used as the substrate 91, when the entire substrate 91 is electrically connected to the source electrode 95, the need of forming a source electrode pad on the front surface (upper surface) side of the HEMT device 90 is eliminated, which is advantageous in terms of layout and which further produces an advantage of reducing on-resistance. And, there is known current collapse which may occur in a GaN-based HEMT device. The current collapse is a phenomenon in which current is reduced at the time of switching from OFF to ON during large current operation time. It is known that setting the conductive substrate 91 side to a constant potential so as to suppress electric field concentration is effective also from a viewpoint of suppressing the current collapse. On the other hand, however, the use of the highly conductive substrate produces a disadvantage that a leak is caused between the source electrode 95 and drain electrode 96 through the substrate 91 to degrade breakdown characteristics between the source electrode 95 and drain electrode 96. In order to improve this, in the structure of FIG. 6, the p-type GaN layer 92 is inserted between the n-GaN (substrate 91) and channel layer 93. In this case, the conductive substrate 91 is biased by a p-n junction between the substrate 91 and GaN layer 92, so that a leak through the substrate 91 is suppressed. However, there may be a case where positive holes in the p-type GaN layer 92 adversely affect the operation (gate current or drain current) of the HEMT device 90. To suppress this, a configuration in which an n-type layer and a p-type layer are further inserted between the p-type GaN layer 92 and channel layer 93 is proposed in Patent Document 1.

In the case where the insulating material such as sapphire, a leak through the substrate 91 does not occur; however, the source electrode configuration as described above cannot be achieved and, accordingly, the above advantage cannot be obtained. Thus, also in this case, the conductive semiconductor layer (p-type GaN layer 92) is inserted between the insulating substrate 91 and channel layer 93. With this configuration, the same advantage as in the case where the conductive substrate 91 is used can be obtained.

As a result, as described above, to form the p-type GaN layer 92 on the substrate 91 is effective irrespective of the type of the substrate 91.

CITATION LIST

Patent Document

[Patent Document 1] Jpn. Pat. No. 2000-150538

Like the channel layer 93 and electron supply layer 94, the p-type GaN layer 92 is formed by epitaxial growth using an MBE (Molecular Beam Epitaxy) method or an MOVPE (Metalorganic Vapor Phase Epitaxy) method. In this case, as a p-type dopant, Mg, Zn, or the like is used.

In manufacturing the above structure, the p-type dopant does not stay only in the p-type GaN layer 92 but diffuses into the channel layer 93 formed above the p-type GaN layer 92. The diffusion includes not only a case where the p-type dopant simply diffuses from the p-type GaN layer 92 into the channel layer 93 and the like but also the following case. That is, for example, in the case where the channel layer 93 and p-type GaN layer 92 are formed in the same crystal growth apparatus (MBE apparatus or MOVPE reactor), the p-type dopant remaining in the crystal growth apparatus at the time of formation of the p-type GaN layer 92 is introduced into the channel layer 93 formed after the formation of the p-type GaN layer 92. To suppress such diffusion is not easy.

In the case where Mg or the like has diffused into the channel layer 93 (active layer), the Mg functions as, e.g., an electron scatterer to decrease the mobility of electron. That is, the diffusion of the Mg or the like may adversely affect the operation of the HEMT device 90.

Such a situation occurs not in the HEMT device but also in a device, such as a MESFET (Metal-Semiconductor Field Effect Transistor) or an SBD (Schottky Barrier Diode), including a conductive semiconductor layer formed on a substrate and a GaN-based active layer formed on the conductive semiconductor layer.

Thus, in the GaN-based device having a configuration in which the conductive semiconductor layer is inserted between the substrate and active layer, it has been difficult to suppress the adverse affect caused by the dopant in the conductive semiconductor layer.

SUMMARY OF THE INVENTION

The present invention has been made in view of the above problems, and the present invention provides a semiconductor device which suppress adverse affect caused by dopant in a conductive semiconductor layer in a GaN-based device having a structure in which the conductive semiconductor layer is inserted between a substrate and an active layer.

To solve the above problems, the present invention is configured as follows.

A semiconductor device according to an aspect of the present invention comprises a structure in which an active layer having a composition represented by the chemical formula: $Al_xM_yGa_{1-x-y}N$ ($0 \leq x<1$, $0 \leq y<1$, $0 \leq x+y<1$, where M contains at least one of In and B) is formed above a substrate and a conductive semiconductor layer having a composition represented by the chemical formula: $Al_pM_qGa_{1-p-q}N$ ($0 \leq p<1$, $0 \leq q<1$, $0 \leq p+q<1$) is formed between the substrate and active layer, wherein a semi-insulating semiconductor layer having a composition represented by the chemical formula: $Al_rM_sGa_{1-r-s}N$ ($p<r<1$, $x<r$, $0 \leq s<1$, $0 \leq r+s<1$) is formed between the active layer and conductive semiconductor layer.

In the semiconductor device according to the present invention, the conductivity of the conductive semiconductor layer is set higher on the substrate side and set lower on the semi-insulating semiconductor layer side.

In the semiconductor device according to the present invention, the composition of the semi-insulating semiconductor layer is varied in the thickness direction of the semi-insulating semiconductor layer so that r=p and s=q are satisfied on the conductive semiconductor layer side, r=x and s=y are satisfied on the active layer side, and p<r and x<r is satisfied in the intermediate portion between the conductive semiconductor layer side and active layer side.

In the semiconductor device according to the present invention, the composition of the conductive semiconductor layer is varied in the thickness direction of the semi-insulating semiconductor layer so that p=s and q=s are satisfied on the semi-insulating semiconductor layer side.

A semiconductor device according to another aspect of the present invention comprises a structure in which an active layer having a composition represented by the chemical formula: $Al_xM_yGa_{1-x-y}N$ ($0 \leq x<1$, $0 \leq y<1$, $0 \leq x+y<1$, where M contains at least one of In and B) is formed above a substrate, wherein at least two conductive semiconductor layers each having a composition represented by the chemical formula: $Al_pM_qGa_{1-p-q}N$ ($0 \leq p<1$, $0 \leq q<1$, $0 \leq p+q<1$) and at least two semi-insulating semiconductor layers each having a composition represented by the chemical formula: $Al_rM_sGa_{1-r-s}N$ ($p<r<1$, $x<r$, $0 \leq s<1$, $0 \leq r+s<1$) are alternately stacked between the substrate and active layer in the order that the lowermost conductive semiconductor layer contacts the substrate and uppermost semi-insulating semiconductor layer contacts the active layer.

In the semiconductor device according to the present invention, the conductivity of the conductive semiconductor layer formed on the substrate side is higher than that of the conductive semiconductor layer formed on the active layer side.

In the semiconductor device according to the present invention, the substrate exhibits n-type conductivity, and the conductive semiconductor layer exhibits p-type conductivity.

In the semiconductor device according to the present invention, the substrate is semi-insulating.

In the semiconductor device according to the present invention, the substrate is made of GaN.

In the semiconductor device according to the present invention, the substrate is made of sapphire.

A manufacturing method of a semiconductor device is a manufacturing method of the above semiconductor device, wherein the conductive semiconductor layer, semi-insulating semiconductor layer, and active layer are sequentially formed on the substrate in the same crystal growth apparatus.

With the above configuration, it is possible to suppress adverse affect caused by dopant in a conductive semiconductor layer in a GaN-based device having a structure in which the conductive semiconductor layer is inserted between a substrate and an active layer.

DESCRIPTION OF THE PREFERRED EMBODIMENTS

An HEMT (High Electron Mobility Transistor) device will be described below as a semiconductor device according to the embodiment of the present invention. The HEMT device includes a conductive GaN-based semiconductor layer formed on a substrate and an active layer (layer directly involving device operation) formed on the conductive GaN-based semiconductor layer.

First Embodiment

Figure 1:
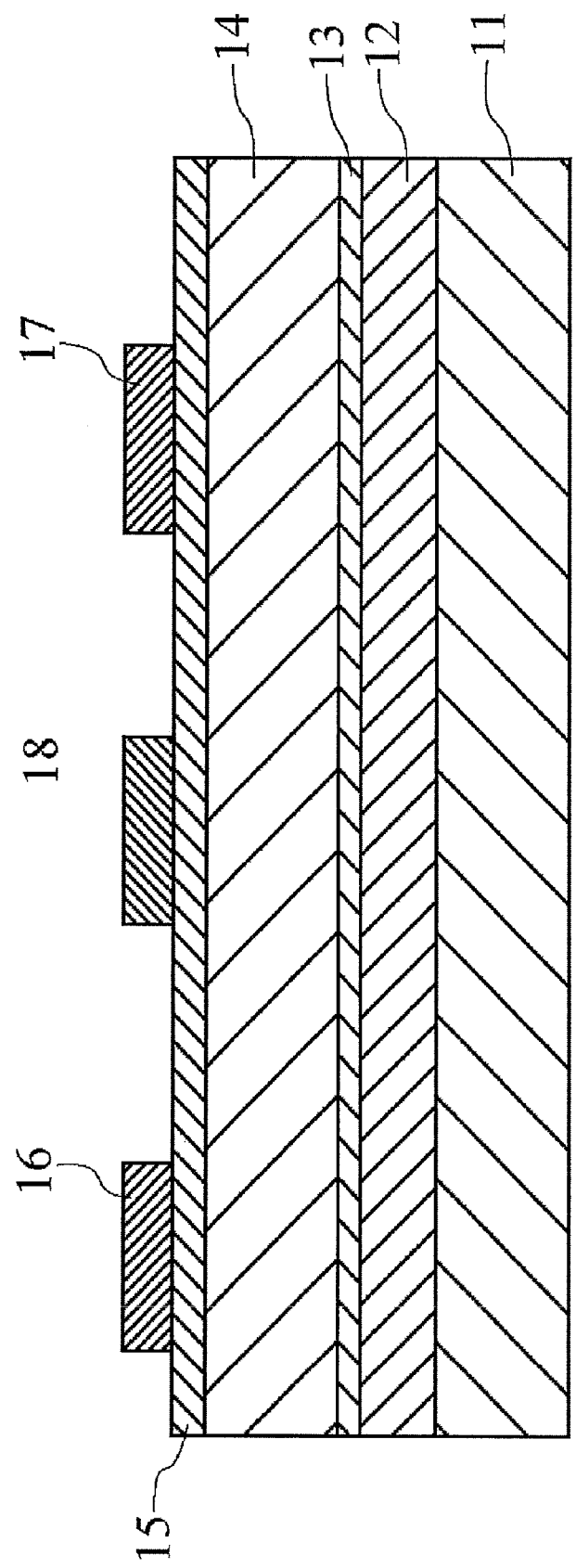
FIG. 1 is a cross-sectional view of an HEMT device according to a first embodiment of the present invention.

FIG. 1 illustrates a cross-sectional structure of an HEMT device according to a first embodiment. In this HEMT device 10, n-GaN (n-type GaN wafer) is used as a substrate 11. A p-type GaN layer (conductive semiconductor layer) 12 is formed on the substrate 11 for the purpose of reducing a leak current and suppressing current collapse, etc. As p-type dopant in the p-type GaN layer 12, Mg or Zn is used. The formation of the p-type GaN layer 12 can be achieved by using the MBE method or MOVPE method.

In this example, a non-doped AlN layer (semi-insulating semiconductor layer) 13 is formed on the p-type GaN layer 12, and a channel layer (active layer) 14 formed of semi-insulating GaN and an electron supply layer (active layer) 15 formed of n-AlGaN are sequentially formed by the MBE method, MOVPE method, or the like. Note that "non-doped" mentioned here means that impurities are not intentionally introduced for control of conductivity. Thus, impurities introduced not intentionally but inevitably are allowed to be contained. The channel layer 14 and electron supply layer 15 each function as an active layer in the HEMT device 10. The n-AlGaN constituting the electron supply layer 15 is n-type $Al_xGa_{1-x}N$ (x=around 0.20). A source electrode 16 and a drain electrode 17 are formed on the electron supply layer 15, and a two-dimensional electron gas is formed on the channel layer 14 side of the interface between the channel layer 14 and electron supply layer 15. ON/OFF of a channel of the two-dimensional electron gas channel is controlled by voltage which is applied to a gate electrode 18 via a depletion layer. The source electrode 16 and drain electrode 17 are each formed of a material that makes ohmic-contact to the electron supply layer 15 (n-AlGaN), such as Ti/Au. The gate electrode 18 is made of a material that makes Schottky-contact to the n-AlGaN and forms a depletion layer in the n-AlGaN, such as Ni/Au.

In the above structure, the substrate 11 is conductive and is set to a constant potential, so that the current collapse can be suppressed. Further, it is possible to make the potentials of the substrate 11 and source electrode 16 equal to each other. Therefore, the entire substrate 11 can be made to serve as the source electrode. In this case, the substrate 11 is biased by a p-n junction between the substrate 11 and p-type GaN layer 12, so that a leak between the source electrode 16 and drain electrode 17 through the substrate 11 (n-GaN) exhibiting conductive property is suppressed.

The HEMT device 10 is featured in that the non-doped AlN layer (semi-insulating semiconductor layer) 13 is formed between the channel layer 14 as an active layer and p-type GaN layer (conductive semiconductor layer) 12. The existence of the non-doped AlN layer 13 can suppress Mg or Zn which is the dopant in the p-type GaN layer 12 from diffusing into the channel layer 14 as an active layer formed above the p-type GaN layer 12. Further, the non-doped AlN layer 13 is a non-doped layer, so that the diffusion of the dopant in the non-doped AlN layer 13 into the upper-side active layer does not occur. The diffusion mentioned here includes not only a case where the dopant simply diffuses from the p-type GaN layer 12 into the channel layer 14 but also the following case. That is, in the case where the p-type GaN layer 12 and channel layer 14 are formed in the same crystal growth apparatus (MBE apparatus or MOVPE reactor), the dopant remaining in the crystal growth apparatus at the time of growth of the p-type GaN layer 12 is doped to the channel layer 14 grew after the growth of the p-type GaN layer 12. It is apparent that, in either case, the interposition of the semi-insulating semiconductor layer 13 can suppress the dopant from being mixed into the channel layer 14 and the like. Particularly, in the latter case, the formation of the non-doped AlN layer 13 is effective when a manufacturing method is adopted in which the p-type GaN layer 12, semi-insulating semiconductor layer 13, channel layer 14, and the like are formed in the same crystal growth apparatus. In this case, the AlN layer is adhered on the dopant element adhered to the inner wall of, e.g., the crystal growth apparatus, thereby suppressing the dopant from being mixed into the channel layer 14 at the time of growth thereof.

The dopant such as a donor or an acceptor is not intentionally doped to the non-doped AlN layer 13, and the non-doped AlN layer 13 has a larger band gap of 6.3 eV relative to 3.4 eV of the GaN. Thus, the insulating property of the non-doped AlN layer 13 is sufficiently high, thereby suppressing a leak between the source electrode 16 and drain electrode 17 through the in-plane direction of the non-doped AlN layer 13. Further, a large lattice mismatch occurs between the AlN and layers (channel layer 14 and p-type GaN layer (GaN) 12) above and under the AlN. In order to suppress an occurrence of crystal defect in the channel layer 14 due to the lattice mismatch, it is preferable to reduce the thickness of the non-doped AlN layer 13. Therefore, the thickness of the non-doped AlN layer (semi-insulating semiconductor layer) 13 is set in consideration of the suppression effect on the diffusion of Mg or the like and influence of the crystal defect.

Figure 2:
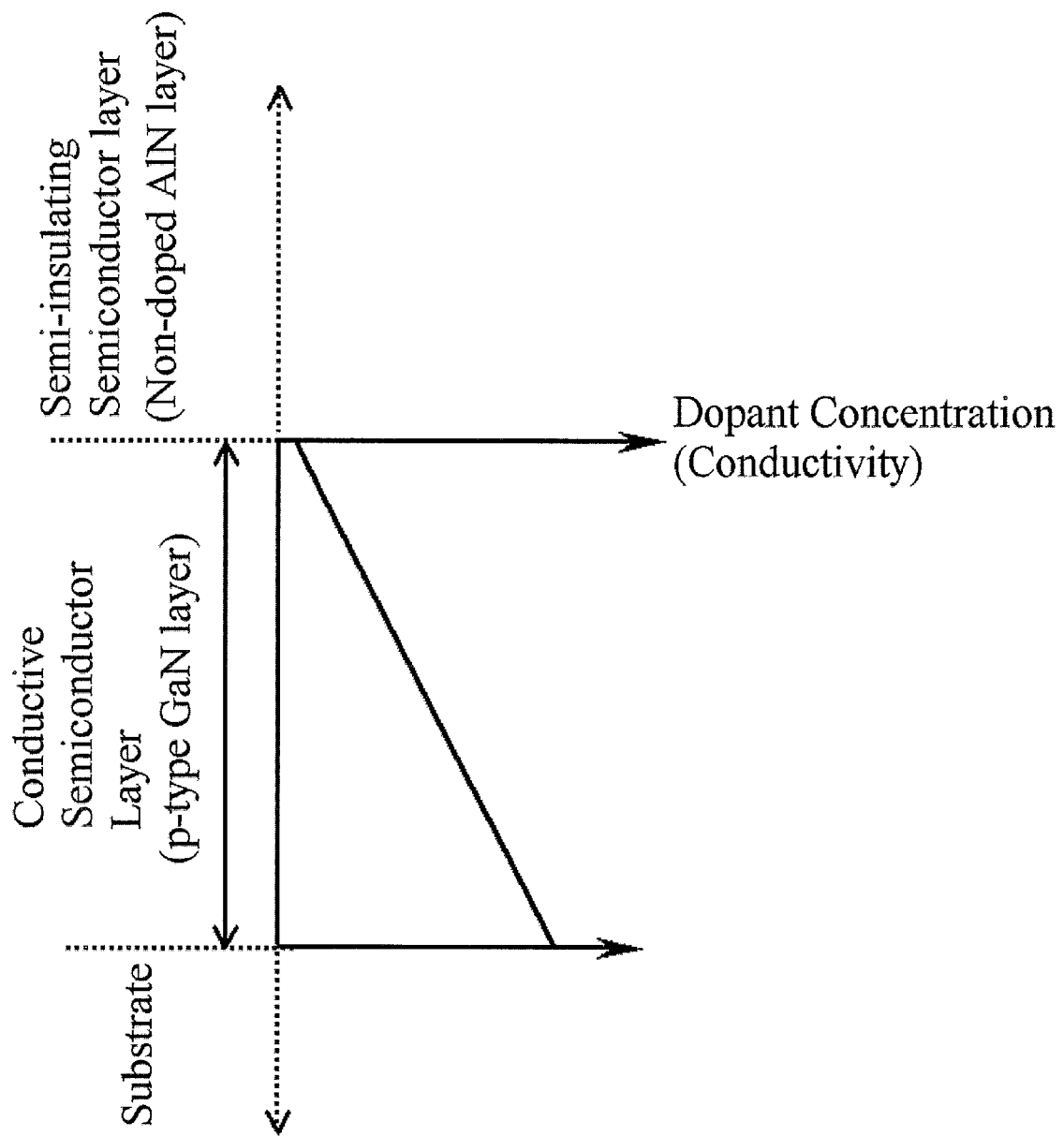
FIG. 2 is a view illustrating an example of depth profile of dopant in a conductive semiconductor layer in the HEMT device according to the first embodiment of the present invention.

It is preferable to set the concentration distribution of the dopant (Mg, Zn, or the like) in the p-type GaN layer 12 so as to enhance the effect described above. An example of the depth profile of dopant concentration in the p-type GaN layer 12 is illustrated in FIG. 2. In this example, the p-type dopant concentration is set higher (conductivity is set higher) on the substrate 11 side at which the p-n junction is formed, while the concentration is set lower (conductivity is set lower) on the semi-insulating semiconductor layer 13 side at which the diffusion needs to be suppressed. With this configuration, it is possible to ensure the effect that a leak current is suppressed due to formation of the p-n conjunction and to allow further suppression of the diffusion of the dopant. The configuration illustrated in FIG. 2 can be easily achieved by controlling the dopant amount at the time of growth of the p-type GaN layer 12.

Further, it is apparent that the use of such a semi-insulating semiconductor layer (non-doped AlN layer) 13 is effective as long as the conductive semiconductor layer (p-type GaN layer) 12 is formed between the active layer (channel layer 14 or electron supply layer 15) and substrate 11. Thus, in the case where a material other than n-GaN, such as semi-insulating GaN, SiC, or insulating sapphire is used as the substrate 11, the same configuration may be adopted. Note that in the case where a material other than GaN is used as the substrate 11, it is preferable to form an AlN layer or the like between the substrate 11 and conductive semiconductor layer (p-type GaN layer) as a buffer layer. In the case where the insulating substrate is used, the potential on the substrate 11 side can be set to constant by the p-type GaN layer 12, so that the current collapse can be suppressed. Also in this case, the diffusion of the dopant into the active layer can be suppressed. In the above example, since n-GaN is used as the substrate 11, a p-type layer is used as the conductive semiconductor layer 12; however, in the case where a semi-insulating or insulating substrate is used, an n-type layer is used as the conductive semiconductor layer 12. Further, it is apparent that in the case where the substrate 11 exhibits p-type conductivity, an n-type layer may be used as the conductive semiconductor layer 12.

Although the semi-insulating semiconductor layer 13 is used as the non-doped AlN layer in the above example, any semiconductor layer may be used as the semi-insulating semiconductor layer 13 as long as it can suppress the diffusion of the dopant in the lower layer, exhibiting the ignorable diffusion level of the dopant therefrom, and exhibiting sufficiently high insulating property than those of the substrate 11 and active layer.

Further, although the active layer (channel layer 14) is formed of GaN in the above example, the channel layer 14 may be formed of a GaN-based mixed crystal semiconductor represented by the following chemical formula: $Al_xM_yGa_{1-x-y}N$ ($0 \le x < 1$, $0 \le y < 1$, $0 \le x+y < 1$, where M contains at least one of In and B). Correspondingly, the conductive semiconductor layer 12 may be formed of a conductive semiconductor represented by the following chemical formula: $Al_pM_qGa_{1-p-q}N$ ($0≤p<1$, $0≤q<1$, $0≤p+q<1$) in place of p-type GaN. In this case, the semi-insulating semiconductor layer 13 may be formed of a non-doped semi-insulating semiconductor, which is richer in Al and has a larger band gap than the active layer and conductive semiconductor layer 12, represented by the following chemical formula: $Al_rM_sGa_{1-r-s}N$ ($p<r<1$, $x<r$, $0≤s<1$, $0≤r+s<1$). In this case, the values of x, y, p, q, r, and s are set appropriately in the view point of not only obtaining the abovementioned effect but also obtaining the channel layer 14 having favorable crystallinity.

Figure 3:
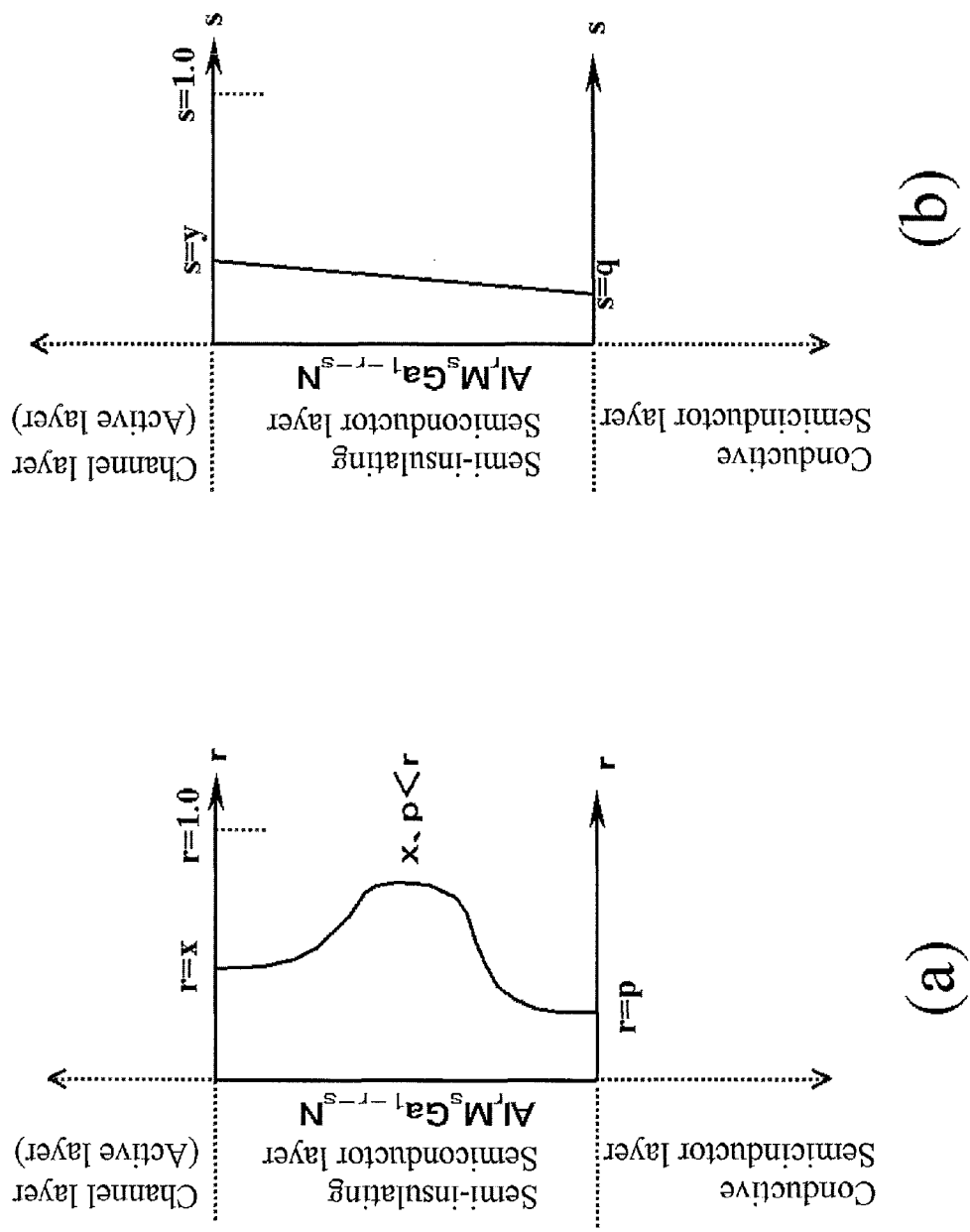
FIG. 3 is a view illustrating an example of depth profile of composition in a semi-insulating semiconductor layer in the HEMT device according to the first embodiment of the present invention.

In this case, the composition (r, s) in the semi-insulating semiconductor layer 13 need not be made uniform. An example of distribution of the composition (r, s) in the semi-insulating semiconductor layer 13 is illustrated in FIGS. 3 (a) and 3 (b). In this example, r and s are varied in the thickness direction so as to provide a gradient in the composition such that r=p and s=q are satisfied on the conductive semiconductor layer 12 side, r=x and s=y are satisfied on the active layer side, and p<r and x<r is satisfied in the intermediate portion between the conductive semiconductor layer 12 side and active layer side. The use of the semi-insulating semiconductor layer 13 having such a composition can reduce the lattice mismatch at the interface between the active layer (channel layer 14) and conductive semiconductor layer 12, thereby obtaining the active layer having better characteristics.

Similarly, the composition (p, q) in the conductive semiconductor layer 12 may be changed in the thickness direction so as to satisfy p=s and q=r on the semi-insulating semiconductor layer 13 side. Also in this case, it is possible to reduce the lattice mismatch at the interface between the semi-insulating semiconductor layer 13 and conductive semiconductor layer 12. In this case, p and q are preferably set so as to reduce the lattice mismatch with the substrate 11 on the substrate 11 side, which is effective particularly when the substrate 11 is formed of a GaN-based semiconductor. Even if the substrate 11 is not formed of a GaN-based semiconductor, when the lattice mismatch with the substrate 11 can be relaxed by optimizing p and q, the same effect can be obtained.

Although the description has been made taking the HEMT device as an example, it is apparent that the present invention may be applied to semiconductor devices other than the HEMT device. That is, according to the present invention, in a semiconductor device having a configuration in which the GaN-based active layer is formed on the conductive GaN-based semiconductor layer, the diffusion of the dopant into the active layer can be suppressed by inserting the semi-insulating semiconductor layer.

Second Embodiment

An HEMT device according to a second embodiment achieves the same effect as in the first embodiment with a different configuration in terms of the structure constituted by the p-type GaN layer (conductive semiconductor layer) 12 and non-doped AlN layer (semi-insulating semiconductor layer) 13.

Figure 4:
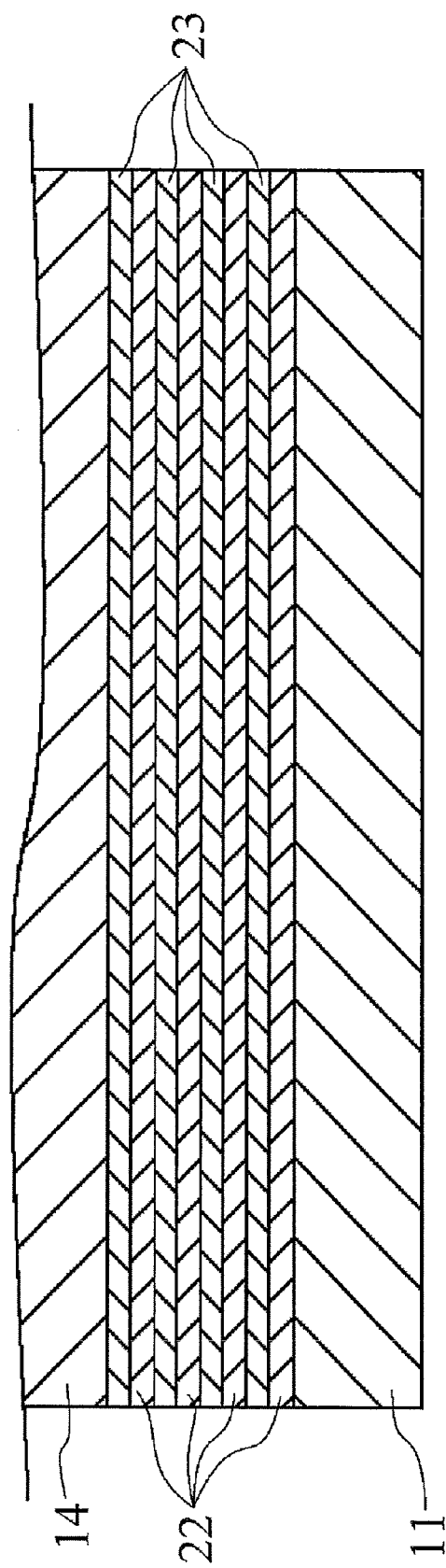
FIG. 4 is a cross-sectional view of an HEMT device according to a second embodiment of the present invention.

FIG. 4 illustrates a part of a cross-sectional structure of the HEMT device according to the second embodiment of the present invention. The upper side structure including the electron supply layer 15 is the same as that in the first embodiment, and the illustration thereof is omitted in FIG. 4. In an HEMT device 20 of this example, four p-type GaN layers (conductive semiconductor layers) 22 and non-doped AlN layers (semi-insulating semiconductor layers) 23 are alternately formed on a substrate 11 and, on the structure constituted by the p-type GaN layers 22 and non-doped AlN layers 23, an channel layer (active layer) 14 is formed. The four p-type GaN layers 22 and non-doped AlN layers 23 are alternately stacked in the order that the lowermost p-type GaN layer 22 contacts the substrate 11 and uppermost non-doped AlN layer 23 contacts the channel layer 14.

The first embodiment corresponds to a case where one p-type GaN layer 22 and one non-doped AlN layer 23 are formed. Thus, it is apparent that also according to the configuration of the second embodiment, the effect of suppressing a leak current and current collapse, which is produced by the p-type GaN layer (conductive semiconductor layer) 22, can be obtained. Further, it is apparent that the effect of suppressing the diffusion of the dopant in the p-type GaN layer 22 into the active layer (channel layer 14), which is produced by the non-doped AlN layer (semi-insulating semiconductor layer) 23, can be obtained. That is, the same effect as in the first embodiment can be obtained.

There is a mismatch in the lattice constant between the p-type GaN layer 22 and non-doped AlN layer 23. However, in the structure of FIG. 4, the thicknesses of the p-type GaN layer 22 and non-doped AlN layer 23 to be stacked are reduced, whereby crystal defect (dislocation) or residual stress caused due to the mismatch can be relaxed. Further, since the channel layer 14 is formed on the structure mentioned above, the quality of the channel layer 14 can be improved more than that in the first embodiment.

Figure 5:
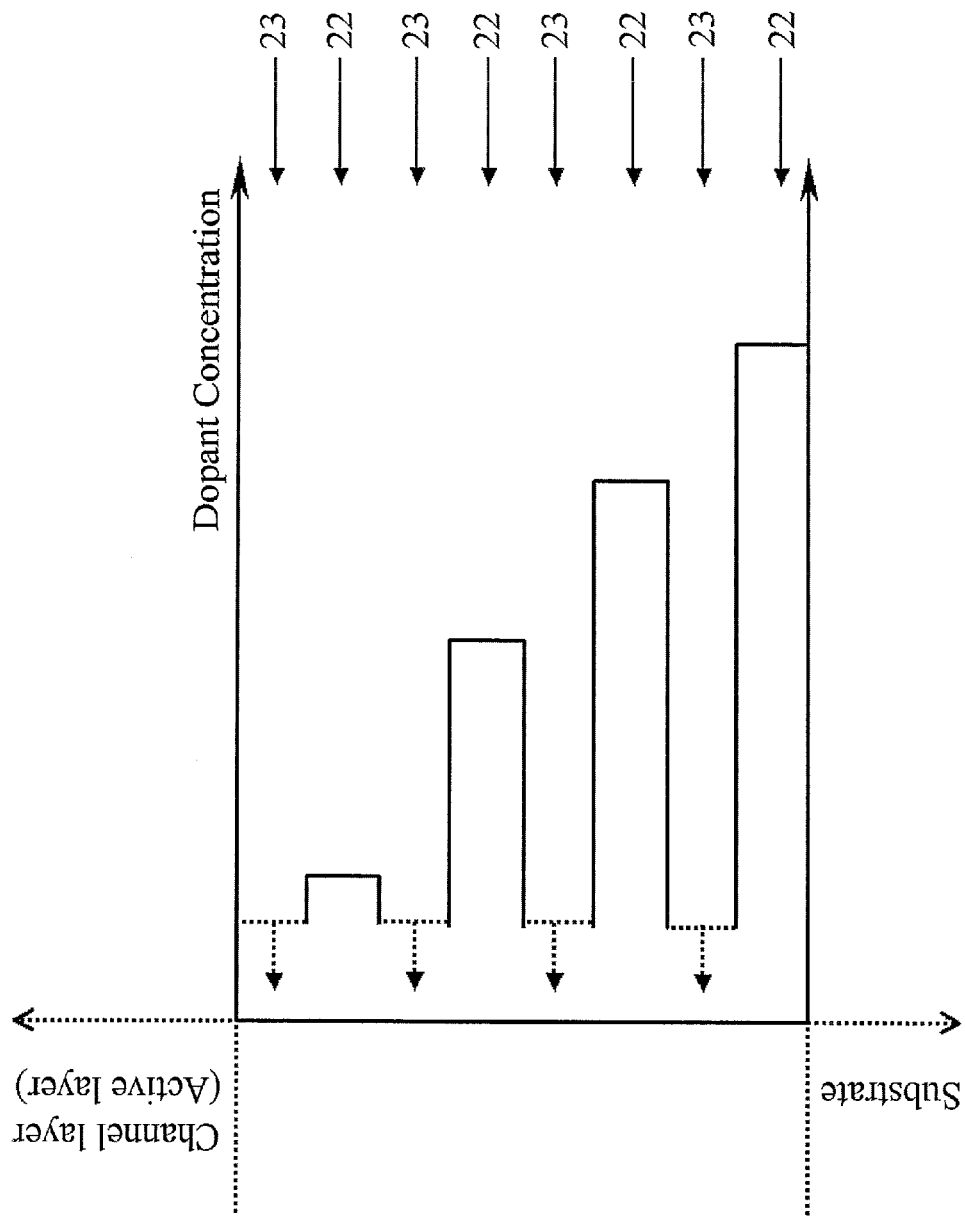
FIG. 5 is a view illustrating an example of depth profile of dopant concentration in a conductive semiconductor layer in the HEMT device according to the second embodiment of the present invention.
Figure 6:
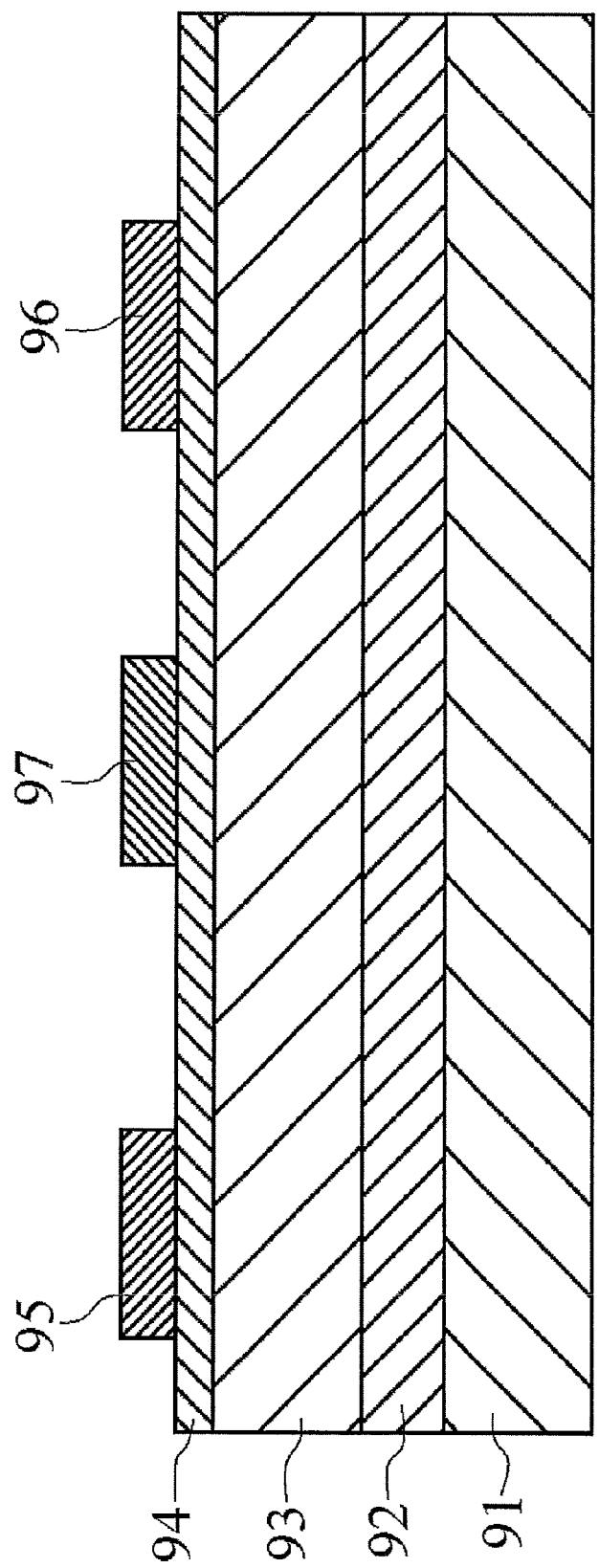
FIG. 6 is a cross-sectional view of a conventional HEMT device using a GaN-based semiconductor.

In this case, as in the case of the first embodiment, the dopant concentration need not be equal between all the p-type GaN layers 22. As illustrated in FIG. 5, it is apparent that by adopting a configuration in which the doping concentrations of the p-type GaN layers 22 is set higher on the substrate 11 side higher and set lower on the active layer (channel layer 14) side, the diffusion of the dopant into the active layer can further be suppressed. In this case, the doping concentration in each p-type GaN layer 22 can be made constant at the time of formation thereof.

The thicknesses of the p-type GaN layers 22 and non-doped AlN layers 23 need not be the same. The number and thickness of the p-type GaN layers 22 and non-doped AlN layers 23 can arbitrarily be set as long as the effects mentioned above can be obtained. Particularly, as to the number of layers, it is only necessary that at least two p-type GaN layers 22 and two non-doped AlN layers 23 are formed.

As in the case of the first embodiment, the channel layer 14 (active layer) may be made of a semiconductor represented by the following chemical formula: $Al_xM_yGa_{1-x-y}N$ ($0≤x<1$, $0≤y<1$, $0≤x+y<1$, where M contains at least one of In and B). Correspondingly, the conductive semiconductor layer 22 may be formed of a conductive semiconductor represented by the following chemical formula: $Al_pM_qGa_{1-p-q}N$ ($0≤p<1$, $0≤q<1$, $0≤p+q<1$) in place of p-type GaN. The semi-insulating semiconductor layer 23 may be formed of a non-doped semi-insulating semiconductor represented by the following chemical formula: AlrMsGa1-r-sN ($p<r<1$, $x<r$, $0≤s<1$, $0≤r+s<1$) in place of the non-doped AlN. Further, as in the case of the first embodiment, the values of p, q, r, and s need not be made uniform in each of a single conductive semiconductor layer 22 and single semi-insulating semiconductor layer 23 and may be set so as to ensure conformity between adjacent layers at the end portions of the respective layers. Further, as in the case of the first embodiment, conductive n-GaN, semi-insulating GaN, SiC, or insulating sapphire may be used as the substrate 11, and the structure mentioned above may be applied to semiconductor devices other than the HEMT device.

What is claimed is:

1. A semiconductor device comprising a structure in which a channel layer having a composition represented by the chemical formula:

$Al_xM_yGa_{1-x-y}N$ ($0 \leq x<1$, $0 \leq y<1$, $0 \leq x+y<1$, where M contains at least one of In and B) is formed above a substrate and a conductive semiconductor layer having a composition represented by the chemical formula:

$Al_pM_qGa_{1-p-q}N$ ($0 \leq p<1$, $0 \leq q<1$, $0 \leq p+q<1$) is formed between the substrate and the channel layer, wherein a semi-insulating semiconductor layer having a composition represented by the chemical formula:

$Al_rM_sGa_{1-r-s}N$ ($p<r<1$, $x<r$, $0 \leq s<1$, $0 \leq r+s<1$) is formed between the channel layer and the conductive semiconductor layer, and wherein the composition of the semi-insulating semiconductor layer is varied in the thickness direction of the semi-insulating semiconductor layer so that $r=p$ and $s=q$ are satisfied on the conductive semiconductor layer side, $r=x$ and $s=y$ are satisfied on the channel layer side, and $p<r$ and $x<r$ is satisfied in the intermediate portion between the conductive semiconductor layer side and channel layer side.

2. The semiconductor device according to claim 1, wherein the conductivity of the conductive semiconductor layer is set higher on the substrate side and set lower on the semi-insulating semiconductor layer side.

3. The semiconductor device according to claim 1, wherein the composition of the conductive semiconductor layer is varied in the thickness direction of the semi-insulating semiconductor layer so that $p=r$ and $q=s$ are satisfied on the semi-insulating semiconductor layer side.

4. The semiconductor device according to claim 1, wherein the substrate exhibits n-type conductivity, and the conductive semiconductor layer exhibits p-type conductivity.

5. The semiconductor device according to claim 4, wherein the substrate is made of GaN.

6. The semiconductor device according to claim 1, wherein the substrate is semi-insulating.

7. The semiconductor device according to claim 1, wherein the substrate is made of sapphire.

8. A manufacturing method of the semiconductor device as claimed in claim 1, wherein the conductive semiconductor layer, semi-insulating semiconductor layer, and channel layer are sequentially formed on the substrate in the same crystal growth apparatus.

* * * * *